(12) United States Patent
Lee et al.

(10) Patent No.: US 8,697,461 B2
(45) Date of Patent: Apr. 15, 2014

(54) LED MODULE AND MANUFACTURING METHOD THEREOF

(75) Inventors: Won Sang Lee, Gyeonggi-do (KR); Young Keun Kim, Seoul (KR)

(73) Assignee: Daewon Innost Co., Ltd., Hanam, Gyeonggi-do (KR)

( * ) Notice: Subject to any disclaimer, the term of this patent is extended or adjusted under 35 U.S.C. 154(b) by 0 days.

(21) Appl. No.: 13/583,198

(22) PCT Filed: Mar. 18, 2011

(86) PCT No.: PCT/KR2011/001901
§ 371 (c)(1),
(2), (4) Date: Sep. 6, 2012

(87) PCT Pub. No.: WO2011/115457
PCT Pub. Date: Sep. 22, 2011

(65) Prior Publication Data
US 2012/0326195 A1 Dec. 27, 2012

(30) Foreign Application Priority Data

Mar. 19, 2010 (KR) .................. 10-2010-0024862

(51) Int. Cl.
*H01L 21/00* (2006.01)

(52) U.S. Cl.
USPC ............... 438/29; 438/23; 438/26; 438/22; 438/42; 257/98; 257/99; 257/79; 257/81; 257/100; 257/102; 257/13; 257/14; 257/19; 257/59

(58) Field of Classification Search
USPC .......... 438/29, 23, 26, 22, 42; 257/13, 14, 19, 257/59, 79, 81, 95, 98, 99, 100, 102
See application file for complete search history.

(56) References Cited

U.S. PATENT DOCUMENTS

| | | | |
|---|---|---|---|
| 6,573,537 B1 | 6/2003 | Steigerwald et al. | |
| 7,462,871 B2 | 12/2008 | Han et al. | |
| 2006/0166477 A1 | 7/2006 | Wang et al. | |
| 2008/0037252 A1 | 2/2008 | Nii et al. | |
| 2008/0142831 A1 | 6/2008 | Su | |
| 2010/0084683 A1 | 4/2010 | Lai et al. | |
| 2010/0163900 A1* | 7/2010 | Seo et al. | 257/98 |
| 2011/0278624 A1* | 11/2011 | Nam | 257/98 |
| 2012/0115263 A1* | 5/2012 | Matsuda | 438/26 |

FOREIGN PATENT DOCUMENTS

| | | |
|---|---|---|
| JP | 2001-203395 | 7/2001 |
| KR | 10-2005-0113086 | 11/2005 |

(Continued)

OTHER PUBLICATIONS

International Preliminary Report on Patentability for PCT/KR2011/001901 (Sep. 25, 2012).

(Continued)

*Primary Examiner* — Kyoung Lee
*Assistant Examiner* — Ratisha Mehta
(74) *Attorney, Agent, or Firm* — Edwards Wildman Palmer LLP; Steven M. Jensen

(57) ABSTRACT

There is provided a manufacturing method of an LED module including: forming an insulating film on a substrate; forming a first ground pad and a second ground pad separated from each other on the insulating film; forming a first division film that fills a space between the first and second ground pads, a second division film deposited on a surface of the first ground pad, and a third division film deposited on a surface of the second ground pad; forming a first partition layer of a predetermined height on each of the division films; sputtering seed metal to the substrate on which the first partition layer is formed; forming a second partition layer of a predetermined height on the first partition layer; forming a first mirror connected with the first ground pad and a second mirror connected with the second ground pad by performing a metal plating process to the substrate on which the second partition layer is formed; removing the first and second partition layers; connecting a zener diode to the first mirror and connecting an LED to the second mirror; and depositing a fluorescent material so as to fill a space formed by the first mirror and the second mirror.

20 Claims, 5 Drawing Sheets

(56) References Cited

FOREIGN PATENT DOCUMENTS

| KR | 10-0632002 | 9/2006 |
|----|------------|--------|
| KR | 10-0643471 | 10/2006 |
| KR | 10-2007-0087485 | 8/2007 |

OTHER PUBLICATIONS

International Search Report for WO 2011/115457 (Oct. 27, 2011).
Extended European Search Report for European Application No. 11 756 588.7 (Jan. 30, 2014).

* cited by examiner

LED MODULE AND MANUFACTURING METHOD THEREOF

CROSS-REFERENCE TO RELATED APPLICATIONS

This application is a National Phase application filed under 35 USC 371 of PCT International Application No. PCT/KR2011/001901 with an International Filing Date of Mar. 18, 2011, which claims under 35 U.S.C. §119(a) the benefit of Korean Application No. 10-2010-0024862, filed Mar. 19, 2010, the entire contents of which are incorporated herein by reference.

FIELD OF THE INVENTION

The present disclosure relates to an LED module and a method of manufacturing the same.

BACKGROUND OF THE INVENTION

Conventionally, in a general method of manufacturing an LED module, a separate LED element manufactured by assembling an LED element in a lead frame-shaped package and coating the LED element by a fluorescent material is installed on a surface of a PCB substrate to manufacture a module for illumination.

However, as for the LED element manufactured in accordance with this method, a heating property of the LED element is deteriorated and a luminous efficiency becomes decreased, and it is limited to obtain brightness of a conventional light bulb with restriction on a size, and also, cost of the LED element cannot be reduced.

In order to overcome such problems, there has been suggested a chip on board (COB) method in which a metal core PCB (MCPCB) substrate is used without a package and a LED is directly assembled in the MCPCB substrate.

The MCPCB has a high thermal conductivity but a material thereof is expensive. For mass production of the MCPCB, investment in facilities such as a specially designed facility for mass production needs to be followed. Further, in manufacturing the MCPCB, it is difficult to perform a micro process with a size of about 50 um or less. Therefore, it has been deemed that the COB method has a low efficiency in manufacturing a LED module for illumination and the MCPCB is costly and inappropriate for a module for illumination.

Although there has been a research on a high-efficiency LED single chip capable of improving luminosity of an element, such a chip is expensive and a size thereof cannot be reduced since a specially designed package is needed to improve a heat emitting property thereof and also, cost of assembly is very high.

Accordingly, a more efficient manufacturing method of an LED module is demanded.

Some embodiments of the present disclosure provide an LED module and a method of manufacturing the LED module capable of improving a luminous efficiency of an LED element by improving a heat emitting property thereof when a high-luminance LED module is manufactured and capable of manufacturing a small-sized high-luminance LED module at low cost by forming a low-luminance LED into a module.

Further, some embodiments of the present disclosure provide an LED module and a method of manufacturing the LED module capable of improving a light emitting property of each LED element by installing a reflecting plate in each element and capable of manufacturing modules in various shapes, which makes it possible to manufacture a high-luminance LED for illumination having various functions.

Furthermore, some embodiments of the present disclosure provide an LED module and a method of manufacturing the LED module capable of considerably reducing a defect rate of a module and production cost per unit by using a semiconductor process that makes it easy to mass produce.

BRIEF SUMMARY OF THE INVENTION

In accordance with a first embodiment of the present invention, there is provided a manufacturing method of an LED module including: forming an insulating film on a substrate; forming a first ground pad and a second ground pad separated from each other on the insulating film; forming a first division film that fills a space between the first and second ground pads, a second division film deposited on a surface of the first ground pad, and a third division film deposited on a surface of the second ground pad; forming a first partition layer of a predetermined height on each of the division films; sputtering seed metal to the substrate on which the first partition layer is formed; forming a second partition layer of a predetermined height on the first partition layer; forming a first mirror connected with the first ground pad and a second mirror connected with the second ground pad by performing a metal plating process to the substrate on which the second partition layer is formed; removing the first and second partition layers; connecting a zener diode to the first mirror and connecting an LED to the second mirror; and depositing a fluorescent material so as to fill a space formed by the first mirror and the second mirror.

In accordance with a second embodiment of the present invention, there is provided a manufacturing method of an LED module including: inserting a zener diode into a substrate; forming an insulating film on the substrate; forming a first ground pad and a second ground pad separated from each other on the insulating film; forming a first division film that fills a space between the first and second ground pads, a second division film deposited on a surface of the first ground pad, and a third division film deposited on a surface of the second ground pad; forming a first partition layer of a predetermined height on each of the division films; sputtering seed metal to the substrate on which the first partition layer is formed; forming a second partition layer of a predetermined height on the first partition layer; forming a first mirror connected with the first ground pad and a second mirror connected with the second ground pad by performing a metal plating process to the substrate on which the second partition layer is formed; removing the first and second partition layers; connecting an LED to the second mirror; and depositing a fluorescent material so as to fill a space formed by the first mirror and the second mirror.

In accordance with a third embodiment of the present invention, there is provided an LED module including: a first ground pad and a second ground pad separated from each other on a substrate on which an insulating film is formed; a first mirror connected with a surface of the first ground pad; a second mirror connected with a surface of the second ground pad; a zener diode connected with the first mirror; an LED positioned on a partial surface of the second mirror; and a fluorescent material formed on the zener diode and the LED, wherein the other surface of the first mirror and the other surface of the second mirror face each other.

In view of the foregoing, it is possible to improve a heat emitting property when a high-luminance LED module is manufactured and possible to manufacture a small-sized high-luminance LED module at low cost by forming a low-luminance LED into a module.

Further, in view of the foregoing, it is possible to improve a light emitting property of each LED element by installing a reflecting plate in each element and possible to manufacture modules in various shapes, which makes it possible to manufacture a high-luminance LED for illumination having various functions.

Furthermore, in view of the foregoing, it is possible to considerably reduce a defect rate of a module and production cost per unit by using a semiconductor process which makes it easy to mass produce.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1A:
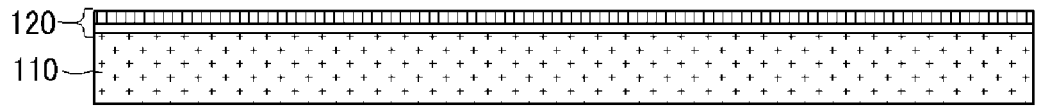
FIGS. 1a to 1h are diagrams illustrating a manufacturing method of an LED module in accordance with an embodiment of the present disclosure.

Hereinafter, embodiments of the present invention will be described in detail with reference to the accompanying drawings so that the present invention may be readily implemented by those skilled in the art. However, it is to be noted that the present invention is not limited to the embodiments but can be realized in various other ways. In the drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, the term "comprises or includes" and/or "comprising or including" used in the document means that one or more other components, steps, operation and/or existence or addition of elements are not excluded in addition to the described components, steps, operation and/or elements.

FIGS. 1a to 1h are diagrams illustrating a manufacturing method of an LED module in accordance with an embodiment of the present disclosure.

An LED module in accordance with an embodiment of the present disclosure includes a first ground pad 142 and a second ground pad 144 which are separately formed on a substrate 110 on which an insulating film 120 is formed, a first mirror 182 of which a surface is connected with the first ground pad 142, a second mirror 184 of which a surface is connected with the second ground pad 144, a zener diode 191 connected with the first mirror 182, an LED 192 positioned on a partial surface of the second mirror 184, and a fluorescent material 194 formed on the zener diode 191 and the LED 192, and the other surface of the first mirror 182 and the other surface of the second mirror 184 may face each other. Hereinafter, a manufacturing method of the LED module will be explained in more detail.

Above all, as depicted in FIG. 1a, the insulating film 120 is formed on the substrate 110. To be specific, Al metal is deposited on the Si substrate 110 and an anodic aluminum oxide (AAO) layer having nano pores of 5 nm or less is formed by anodic oxidation and then, a silicon oxide ($SiO_2$) layer is deposited by using a plasma chemical vapor deposition apparatus to manufacture the insulating film 120 for a LED module. Details of the process of manufacturing the insulating film 120 may be found in prior art (Korean Patent No. 10-0899894) of the present applicant.

Figure 1B:
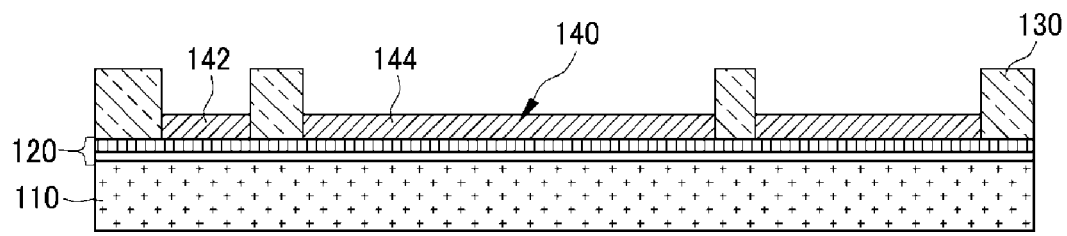

Thereafter, as depicted in FIG. 1b, a ground pad 140 is formed on the insulating film 120 and includes the first ground pad 142 and the second ground pad 144 which are separated from each other. Here, seed metal may be sputtered to the insulating film 120 and a photo process and a metal plating process using a photoresist layer 130 for manufacturing the first ground pad 142 and the second ground pad 144 may be performed, so that the first ground pad 142 and the second ground pad 144 may be formed.

To be more specific, Ti or Au as seed metal for electroplating is sputtered and coated with a photosensitive film and a pattern for manufacturing a ground pad is formed by a photo process. Then, a ground pad is manufactured with Cu or Au by electroplating.

Figure 1C:
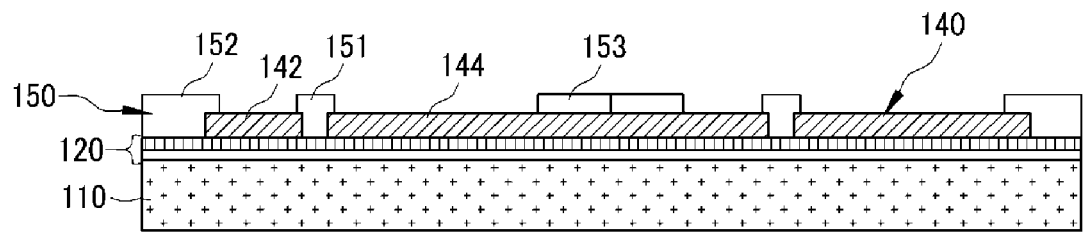

Subsequently, as depicted in FIG. 1c, a division film 150 is formed and includes a first division film 151 configured to fill a gap between the ground pads 142 and 144, a second division film 152 configured to be layered on a surface of the first ground pad 142, and a third division film 153 configured to be layered on a surface of the second ground pad 144.

Here, the first division film 151 to the third division film 153 may be formed by coating the first ground pad 142 and the second ground pad 144 with a polymer.

Figure 1D:
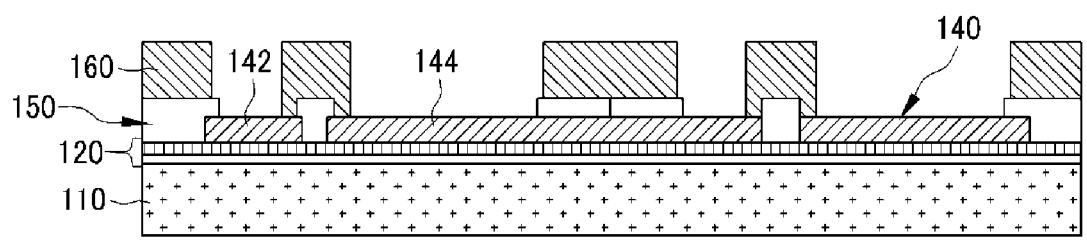

Then, as depicted in FIG. 1d, a first partition layer 160 of a predetermined height is formed on the division film 150. Here, the first partition layer 160 may be formed by layering a first photoresist layer on the substrate 110 on which the division film 150 is formed and etching the first photoresist layer such that a part of the first and second ground pads 142 and 144 is exposed.

Figure 1E:
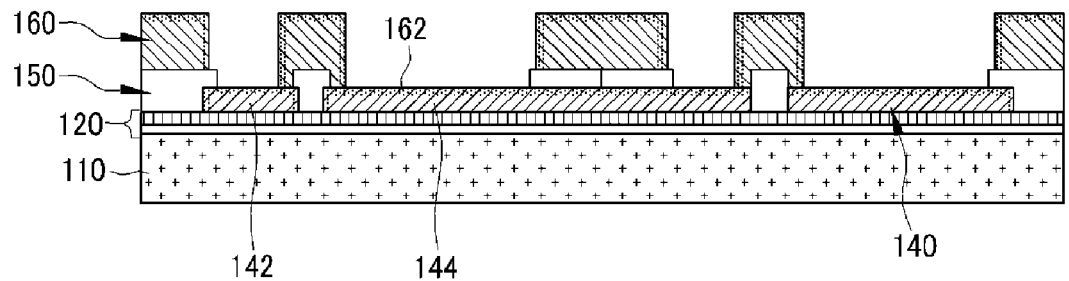

Thereafter, as depicted in FIG. 1e, seed metal 162 is sputtered to the substrate 110 on which the first partition layer 160 is formed.

Figure 1F:
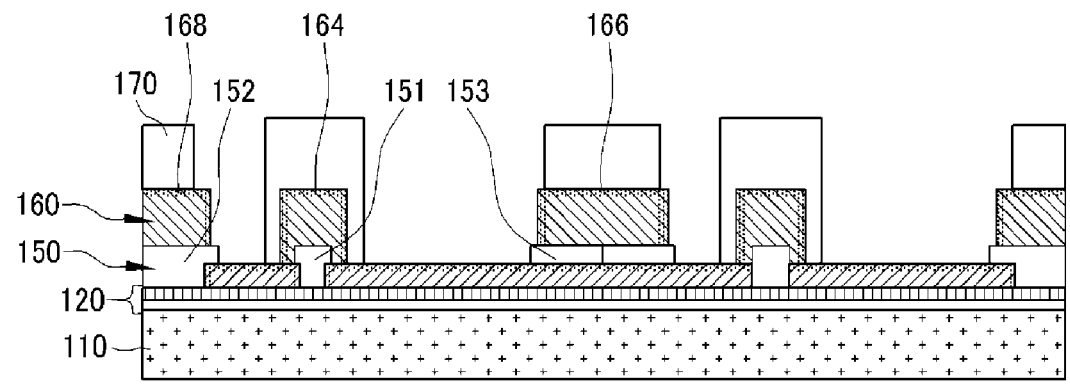

Further, as depicted in FIG. 1f, a second partition layer 170 of a predetermined height is formed on the first partition layer 160. To be specific, a second photoresist layer is layered on the substrate 110 to which a sputtering process is performed and the second photoresist layer is etched such that a part of the first and second ground pads 142 and 144 is exposed and an entire upper surface 164 of the first partition layer 160 formed on the first division film 151 is covered by the second photoresist layer.

Here, the second partition layer 170 may be formed such that the entire upper surface 164 of the first partition layer 160 formed on the first division film 151 is covered by the second partition layer 170. Further, the second partition layer 170 may be formed so as to expose a part of upper surfaces 166 and 168 of the first partition layers 160 formed on the second and third division films 152 and 153, respectively, by the second partition layer 170. With this configuration, it is possible to prevent a mirror 180 from being formed around the first partition layer 160 formed on the first division film 151.

Figure 1G:
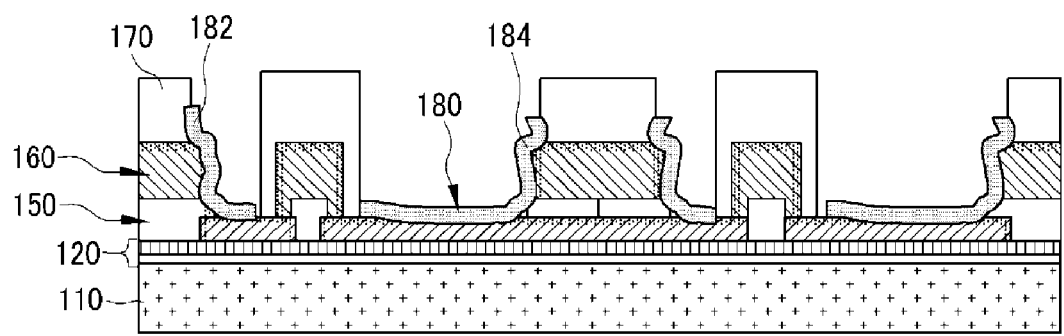

Subsequently, as depicted in FIG. 1g, by performing a metal plating process to the substrate 110 on which the second partition layer 170 is formed, a first mirror 182 connected with the first ground pad 142 and a second mirror 184 connected with the second ground pad 144 are formed. Here, the first mirror 182 and the second mirror 184 may be formed by performing an electroplating process to the substrate 110, on which the second partition layer 170 is formed, with Ni, Su, Cu, Au and Ag.

Thus, as depicted in the drawing, a structure of the mirror 180 may include the first partition layer 160, the seed metal sputtered to the first partition layer 160, and the second partition layer 170 that covers a part of the sputtered seed metal.

Figure 1H:
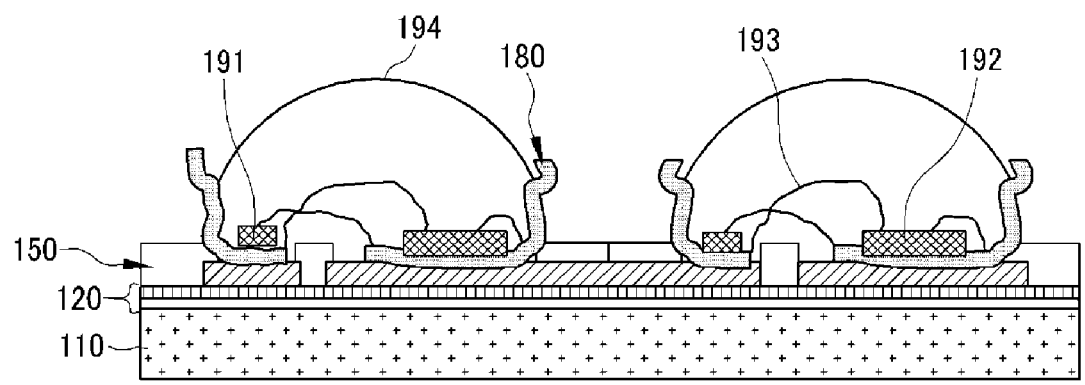

Then, as depicted in FIG. 1h, the first partition layer 160 and the second partition layer 170 are removed.

Thereafter, the zener diode 191 is connected with the first mirror 182 and the LED 192 is connected with the second mirror 184. Further, Au bonding wires 193 are installed for electric wiring and the fluorescent material 194 is deposited so as to fill a space formed by the first mirror 182 and the second mirror 184.

Figure 2:
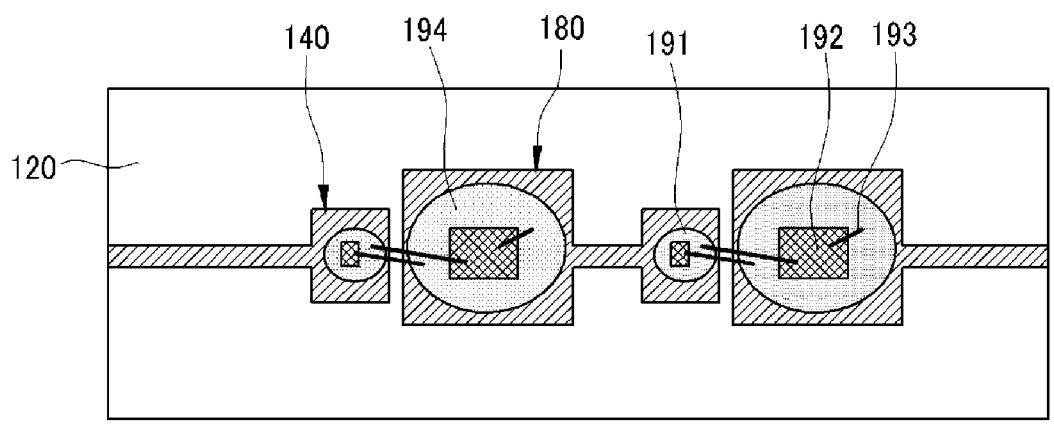
FIG. 2 is a cross-sectional view of an LED module in accordance with an embodiment of the present disclosure.

FIG. 2 is a cross-sectional view of an LED module manufactured by the process depicted in FIGS. 1a to 1h in accordance with an embodiment of the present disclosure.

As depicted in FIG. 2, with the LED module manufactured by the above-described process, it is possible to improve a light emitting property by installing a reflecting plate in each LED element and possible to manufacture modules in various shapes, which makes it possible to manufacture a high-luminance LED for illumination having various functions.

Further, it is possible to considerably reduce a defect rate of a module and production cost per unit by using a semiconductor process that makes it easy to mass produce.

Furthermore, it is possible to assemble LEDs having various color ranks in a single module, which makes it possible to manufacture a sensitive lighting apparatus using an LED.

Figure 3A:
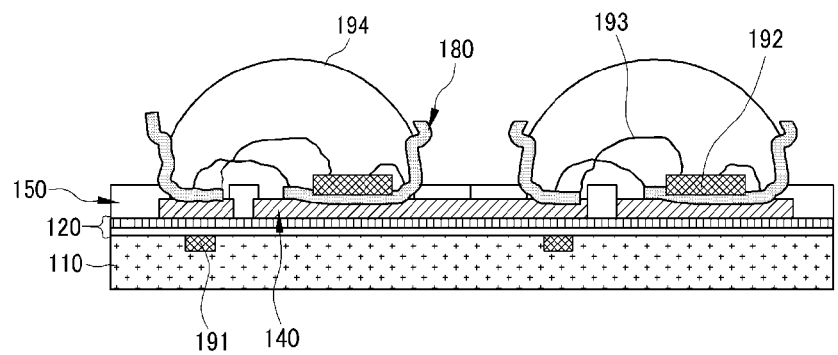
FIGS. 3a to 3c are diagrams illustrating a manufacturing method of an LED module in accordance with another embodiment of the present disclosure.
Figure 3B:
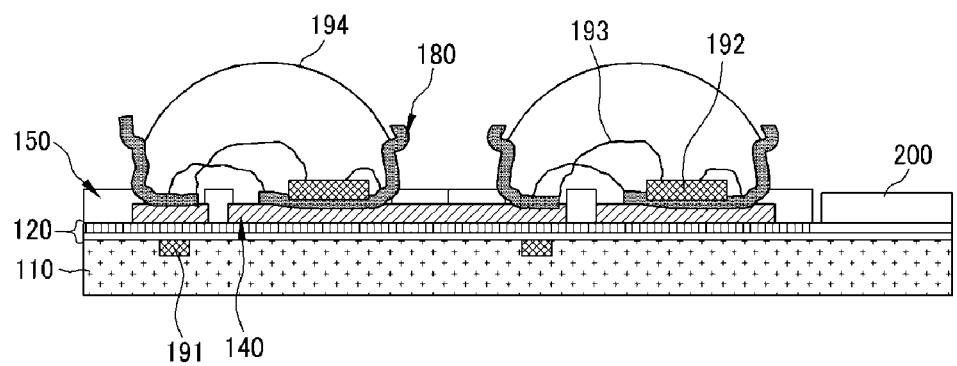
Figure 3C:
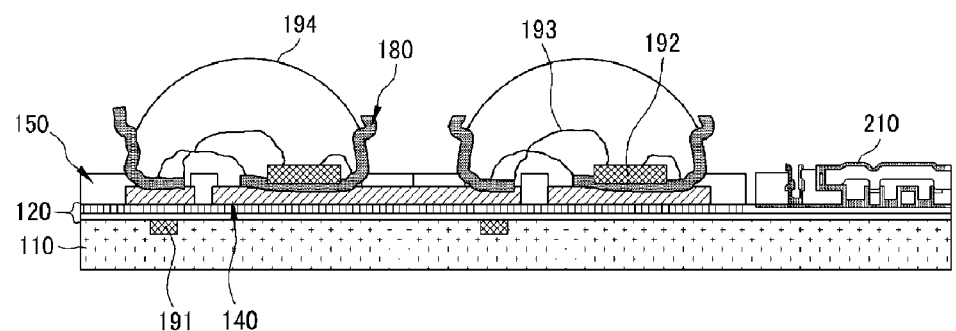

FIGS. 3a to 3c are diagrams illustrating a manufacturing method of an LED module in accordance with another embodiment of the present disclosure.

As depicted in FIG. 3a, before an insulating film 120 is formed on a substrate 110, a zener diode 191 may be inserted into the substrate 110. Here, the inserted zener diode 191 may be positioned under a first mirror 182. If the zener diode 191 is inserted beforehand, a process may be more simplified and a small-sized LED module can be manufactured.

As depicted in FIG. 3b, a driver IC (Integrated Circuit) 120 may be installed on the insulating film 120 of the LED module. That is, the bare driver IC 200 of the LED may be installed on the manufactured LED module and bonding wires may be installed, so that integration density of the module can be increased.

As depicted in FIG. 3c, an integrated passive device 210 may be integrated on the insulating film 120.

Thus, it is possible to improve a luminous efficiency of the LED element by improving a heat emitting property thereof when a high-luminance LED module is manufactured and possible to manufacture a small-sized high-luminance LED module at low cost by forming a low-luminance LED into a module.

Figure 4:
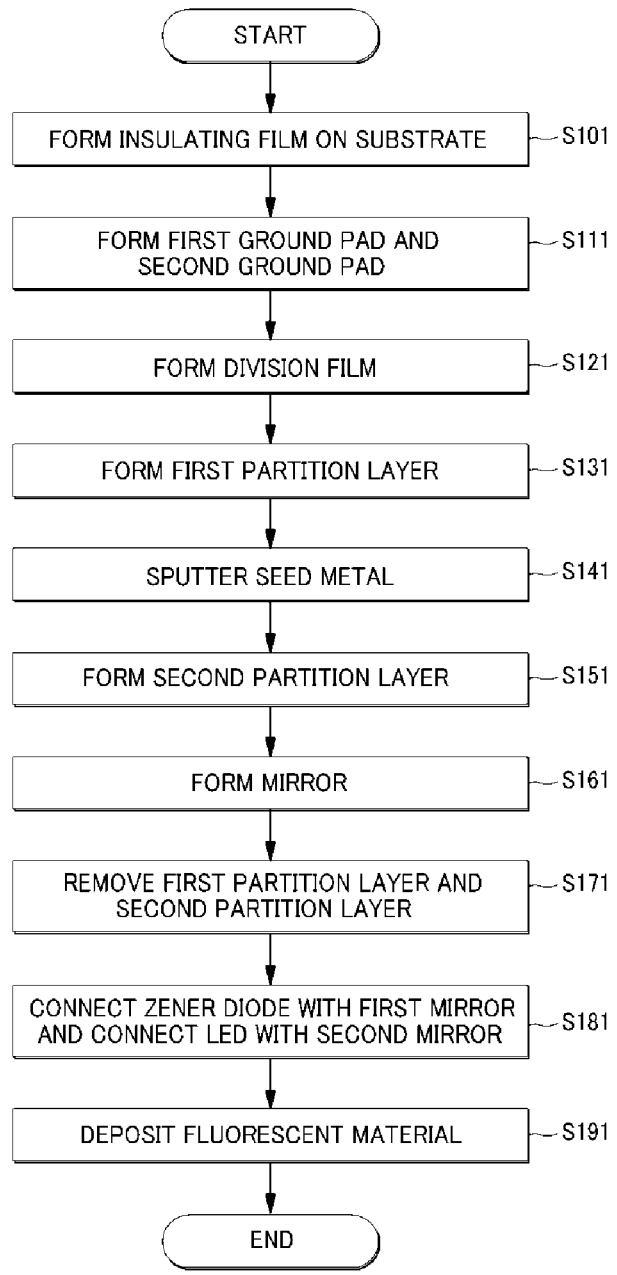
FIG. 4 is a flowchart of a manufacturing method of an LED module in accordance with an embodiment of the present disclosure.

FIG. 4 is a flowchart of a manufacturing method of an LED module in accordance with an embodiment of the present disclosure.

First of all, an insulating film 120 is formed on a substrate 110 (S101). Here, an aluminum oxide layer may be formed on the substrate 110 and a silicon oxide ($SiO_2$) layer may be deposited on the aluminum oxide layer, so that the insulating film 120 may be formed. Further, in another embodiment, a zener diode 191 may be inserted prior to this step S101.

Then, a first ground pad 142 and a second ground pad 144 which are separated from each other are formed on the insulating film 120 (S111). Here, seed metal may be sputtered seed metal may be sputtered to the insulating film 120 and a photo process and a metal plating process may be performed to manufacture the first ground pad 142 and the second ground pad 144. As the seed metal, Ti or Au may be used and Cu or Au may be used in the metal plating process.

Subsequently, a first division film 151 configured to fill a gap between the ground pads, a second division film 152 configured to be layered on a surface of the first ground pad 142, and a third division film 153 configured to be layered on a surface of the second ground pad 144 are formed (S121). Here, the first division film 151 to the third division film 153 may be formed by coating the first ground pad 142 and the second ground pad 144 with a polymer.

Then, a first partition layer 160 of a predetermined height is formed on each division film (S131). Here, the first partition layer 160 may be formed by layering a first photoresist layer on the substrate 110 on which the division film is formed and etching the first photoresist layer such that a part of the first and second ground pads 142 and 144 is exposed.

Thereafter, seed metal is sputtered to the substrate 110 on which the first partition layer 160 is formed (S141).

Further, a second partition layer 170 of a predetermined height is formed on the first partition layer 160 (S151). Here, the second partition layer 170 may be formed such that an entire upper surface 164 of the first partition layer 160 formed on the first division film 151 is covered by the second partition layer 170. Further, the second partition layer 170 may be formed so as to expose a part of upper surfaces 166 and 168 of the first partition layers 160 formed on the second and third division films 152 and 153, respectively, by the second partition layer 170.

Subsequently, by performing a metal plating process to the substrate 110 on which the second partition layer 170 is formed, a first mirror 182 connected with the first ground pad 142 and a second mirror 184 connected with the second ground pad 144 are formed (S161). The first mirror 182 and the second mirror 184 may be formed by performing an electroplating process to the substrate 110, on which the second partition layer 170 is formed, with Ni, Su, Cu, Au and Ag.

Then, the first partition layer 160 and the second partition layer 170 are removed (S171).

Thereafter, the zener diode 191 is connected with the first mirror 182 and an LED 192 is connected with the second mirror 184 (S181).

Subsequently, a fluorescent material 194 is deposited so as to fill a space formed by the first mirror 182 and the second mirror 184 (S191).

Meanwhile, in another embodiment, a driver IC 200 and an integrated passive device 210 may be integrated together on an insulating film 120 of an LED module.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention. For example, each component described to be of a single type can be implemented in a distributed manner. Likewise, components described to be distributed can be implemented in a combined manner.

The scope of the present invention is defined by the following claims rather than by the detailed description of the embodiment. It shall be understood that all modifications and embodiments conceived from the meaning and scope of the claims and their equivalents are included in the scope of the present invention.

What is claimed is:

1. A manufacturing method of an LED module, comprising:
   forming an insulating film on a substrate;
   forming a first ground pad and a second ground pad separated from each other on the insulating film;
   forming a first division film that fills a space between the first and second ground pads, a second division film deposited on a surface of the first ground pad, and a third division film deposited on a surface of the second ground pad;
   forming a first partition layer of a predetermined height on each of the division films;
   sputtering seed metal to the substrate on which the first partition layer is formed;
   forming a second partition layer of a predetermined height on the first partition layer;
   forming a first mirror connected with the first ground pad and a second mirror connected with the second ground pad by performing a metal plating process to the substrate on which the second partition layer is formed;
   removing the first and second partition layers;
   connecting a zener diode to the first mirror and connecting an LED to the second mirror; and
   depositing a fluorescent material so as to fill a space formed by the first mirror and the second mirror.

2. The manufacturing method of claim 1, wherein forming a first partition layer comprises:
   depositing a first photoresist layer on the substrate on which the division films are formed; and
   etching the first photoresist layer so as to expose a part of the first and second ground pads.

3. The manufacturing method of claim 1, wherein forming a second partition layer comprises covering an entire upper surface of the first partition layer formed on the first division film by the second partition layer.

4. The manufacturing method of claim 1, wherein forming a second partition layer comprises exposing a part of an upper surface of the first partition layer formed on the second and third division films by the second partition layer.

5. The manufacturing method of claim 1, wherein forming a second partition layer comprises:
   depositing a second photoresist layer on the substrate to which seed metal is sputtered; and
   etching the second photoresist layer so as to expose a part of the first and second ground pads and cover an entire upper surface of the first partition layer formed on the first division film by the second photoresist layer.

6. The manufacturing method of claim 1, wherein forming an insulating film comprises;
   forming an anodic aluminum oxide (AAO) layer on the substrate; and
   depositing a silicon oxide ($SiO_2$) layer on an upper surface of the anodic aluminum oxide layer.

7. The manufacturing method of claim 1, wherein forming a first ground pad and a second ground pad comprises:
   sputtering seed metal to the insulating film; and
   performing a photo process and a metal plating process for manufacturing the first and second ground pads.

8. The manufacturing method of claim 7, wherein Ti or Au is used as the seed metal and Cu or Au is used for the metal plating process.

9. The manufacturing method of claim 1, wherein the first to third division films are formed by coating the first and second ground pads by a polymer.

10. The manufacturing method of claim 1, wherein the first to second mirrors are formed by performing an electroplating process to the substrate, on which the second partition layer is formed, with at least one or more of Ni, Su, Cu, Au and Ag.

11. A manufacturing method of an LED module, comprising:
    inserting a zener diode into a substrate;
    forming an insulating film on the substrate;
    forming a first ground pad and a second ground pad separated from each other on the insulating film;
    forming a first division film that fills a space between the first and second ground pads, a second division film deposited on a surface of the first ground pad, and a third division film deposited on a surface of the second ground pad;
    forming a first partition layer of a predetermined height on each of the division films;
    sputtering seed metal to the substrate on which the first partition layer is formed;
    forming a second partition layer of a predetermined height on the first partition layer;
    forming a first mirror connected with the first ground pad and a second mirror connected with the second ground pad by performing a metal plating process to the substrate on which the second partition layer is formed;
    removing the first and second partition layers;
    connecting an LED to the second mirror; and
    depositing a fluorescent material so as to fill a space formed by the first mirror and the second mirror.

12. The manufacturing method of claim 11, wherein the inserted zener diode is positioned under the first mirror.

13. The manufacturing method of claim 11, wherein forming a first partition layer comprises:
    depositing a first photoresist layer on the substrate on which the division films are formed; and
    etching the first photoresist layer so as to expose a part of the first and second ground pads, and
    forming a second partition layer comprises:
    depositing a second photoresist layer on the substrate to which seed metal is sputtered; and
    etching the second photoresist layer so as to expose a part of the first and second ground pads, cover an entire upper surface of the first partition layer formed on the first division film by the second photoresist layer, and expose a part of an upper surface of the first partition layer formed on the second and third division films by the second partition layer.

14. The manufacturing method of claim 11, wherein forming an insulating film comprises:
    forming an anodic aluminum oxide (AAO) layer on the substrate; and
    depositing a silicon oxide ($SiO_2$) layer on an upper surface of the anodic aluminum oxide layer, and
    forming a first ground pad and a second ground pad comprises:
    sputtering seed metal such as Ti or Au to the insulating film; and performing a photo process and a metal plating process using Cu or Au for manufacturing the first and second ground pads.

15. The manufacturing method of claim 11, wherein the first to third division films are formed by coating the first and second ground pads by a polymer, and the first to second mirrors are formed by performing an electroplating process to the substrate, on which the second partition layer is formed, with at least one or more of Ni, Su, Cu, Au and Ag.

16. The manufacturing method of claim 1, further comprising:

connecting a driver IC (Integrated Circuit) with the insulating film.

17. The manufacturing method of claim 1, further comprising:

connecting an integrated passive device with the insulating film.

18. The manufacturing method of claim 11, further comprising:

connecting a driver IC (Integrated Circuit) with the insulating film.

19. The manufacturing method of claim 11, further comprising:

connecting an integrated passive device with the insulating film.

20. The manufacturing method of claim 16, further comprising:

connecting an integrated passive device with the insulating film.

\* \* \* \* \*